(12) United States Patent
Miura et al.

(10) Patent No.: US 7,859,282 B2
(45) Date of Patent: Dec. 28, 2010

(54) ELECTRICAL CONNECTING APPARATUS

(75) Inventors: Kiyotoshi Miura, Hirakawa (JP);
 Hitoshi Sato, Minamitsugaru-gun (JP);
 Akihisa Akahira, Hirakawa (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 77 days.

(21) Appl. No.: 12/517,040

(22) PCT Filed: Mar. 20, 2007

(86) PCT No.: PCT/JP2007/056518
§ 371 (c)(1),
(2), (4) Date: May 29, 2009

(87) PCT Pub. No.: WO2008/114464
PCT Pub. Date: Sep. 25, 2008

(65) Prior Publication Data
US 2010/0066396 A1  Mar. 18, 2010

(51) Int. Cl.
 *G01R 31/02* (2006.01)
(52) U.S. Cl. .............. 324/757; 324/158.1; 324/754
(58) Field of Classification Search .......... 324/158.1, 324/750–758, 760–765; 439/74, 61, 492, 439/578, 581
See application file for complete search history.

(56) References Cited

U.S. PATENT DOCUMENTS 5,949,243 A * 9/1999 Grasso ................ 324/761
7,458,818 B2 * 12/2008 Kiyofuji et al. ........... 439/66

FOREIGN PATENT DOCUMENTS

| JP | 01304372 | 12/1989 |
|---|---|---|
| JP | 2003528459 | 9/2003 |
| JP | 2004191064 | 7/2004 |
| JP | 2007003334 | 1/2007 |
| WO | WO0171779 A2 | 9/2001 |

OTHER PUBLICATIONS

Pat. Abstract of JP (01304372), Dec. 7, 1989, Hitachi Electron Eng. Co. LTD.
Pat. Abstract of JP (2004191064), Jul. 8, 2004, Micronics Japan Co. LTD.
Pat. Abstract of JP (2007003334), Jan. 11, 2007, Micronics Japan Co. LTD.

* cited by examiner

*Primary Examiner*—Minh N Tang
*Assistant Examiner*—Trung Q Nguyen
(74) *Attorney, Agent, or Firm*—Ingrassia Fisher & Lorenz, P.C.

(57) ABSTRACT

An electrical connecting apparatus for use in electrical measurement of a device under test comprises a supporting member and a flat plate-like probe base plate. On one surface of the probe base plate are provided multiple probes abutting on electrical connecting terminals of the device under test undergoing an electrical test. Also, on the other surface of the probe base plate is formed a securing portion provided with a screw hole opened at the top portion. It further has a generally cylindrical spacer and a screw member passing through the spacer and whose tip end is screwed in the screw hole of the securing portion. As for the spacer, movement in the axial direction is restricted in relation to the supporting member by a restricting means. The spacer has a head portion whose underside is mounted on the other surface of the supporting member and a body portion communicating with the head portion at one end, arranged to pass through a through hole formed in the supporting member, and whose other end is arranged to abut on the top face of the securing portion.

13 Claims, 10 Drawing Sheets

ELECTRICAL CONNECTING APPARATUS

TECHNICAL FIELD

The subject matter relates to an electrical connecting apparatus such as a probe card for use in connection between an electric circuit of an integrated circuit such as a device under test and an electric circuit of a tester for an electrical test thereof.

BACKGROUND ART

As a conventional electrical connecting apparatus of this kind, an electrical connecting apparatus having a probe base plate in which a plurality of probes are provided and enabling adjustment of the flatness of the probe base plate has been proposed (See Patent Literature 1). This electrical connecting apparatus can act pressure or tensile force from a supporting member supporting the probe base plate on a central portion of the probe base plate. Even if a bend is produced in the probe base plate, the bending deformation of the probe base plate can be modified by the adjustment of this action, thereby maintaining the flatness of the probe base plate.

In producing a probe base plate in which a plurality of probes are provided, therefore, even if a bending deformation is produced in the probe base plate, the above-mentioned adjusting work after attaching the probe base plate to the supporting member enables to keep the probe base plate flat, so that the multiple probe tips extending from the probe base plate can be maintained on the same plane. This enables all the probe tips to surely contact an electrical connecting terminal corresponding to each of the above-mentioned probes of the electric circuit of the device under test, thereby obtaining a favorable electrical contact therebetween.

According to the conventional art described in Patent Literature 1, however, it is necessary to adjust so that all the probe tips may be positioned on the same plane according to the bending deformation introduced into each probe base plate every time the probe base plate is attached to the supporting member. The work of adjusting to make all the probe tips contact properly each corresponding electrical connecting terminal of the device under test in a state where the probe base plate is attached to the supporting member is complicated and requires skill. Particularly, in testing of numerous integrated circuits formed on a semiconductor wafer, since the number of probes provided on the probe base plate remarkably increases, it is difficult to adjust to make such numerous probes contact properly each corresponding pad on the semiconductor wafer. Also, when the probe base plate is enlarged along with enlargement trend of the device under test, adjustment of only the central portion of the probe base plate cannot deal with the trend. Further, the adjustability causes a problem in maintaining the flatness of the probe base plate in a stable manner, which makes the flatness of the probe base plate unstable as time passes.

Under such circumstances, the present applicant proposed in a previous international patent application (PCT/JP2005/009812) an electrical connecting apparatus accomplishing sure electrical connection between a probe and a corresponding electrical connecting terminal of an electric circuit of a device under test without the need for a flatness adjusting work of a probe base plate after being attached to a supporting member regardless of deformation of the probe base plate.

In this electrical connecting apparatus, probes are formed on a probe base plate with bending deformation in a free state without load so that the probe tips may be aligned on the same plane. Between the mounting plane of the supporting member and the probe base plate is arranged a spacer permitting a mounting bolt to be inserted therein, and this spacer acts to maintain the aforementioned deformation of the probe base plate at the time of tightening the mounting bolt. Thus, since the probe base plate is attached to the reference plane of the supporting member in a state of maintaining the aforementioned deformation, all the probe tips are positioned on the same plane.

Accordingly, after the probe base plate is attached to the supporting member, all the probe tips can be thrust to the respective electrical connecting terminals of the electric circuit of the device under test approximately uniformly without the need for the conventional adjusting work for flatness of the probe base plate. Despite the enlargement trend of the probe base plate, the aforementioned conventional troublesome flatness adjusting work is not needed per replacement of the probe base plate in which the multiple probes are provided, which enables an efficient electrical test.

However, the aforementioned spacer is arranged with its one end abutting on the underside of the supporting member and with its lower end abutting on the upper face of a securing portion formed on the probe base plate. Accordingly, when an electrical connecting apparatus is to be assembled by combining a supporting plate with a wiring base plate, etc., the spacer cannot be inserted into the supporting plate from the upper side of the supporting plate but needs to be inserted from the lower side of the wiring base plate through an inserting hole formed in the wiring base plate into the wiring base plate from the lower side thereof so that the upper end of the spacer may abut on the underside of the supporting member. After the spacer is arranged in this manner, the tightening bolt needs to be inserted from the upper face side of the supporting member so as to penetrate the supporting member and the spacer, and its tip end needs to be screwed in a screw hole formed at the top portion of the securing portion of the probe base plate.

In this manner, the spacer will not be inserted into an inserting hole of the tightening bolt of the supporting member, but the spacer needs to be held on the opposite side of the bolt inserting side of the supporting member so that the tightening bolt may pass through the inserting hole of the wiring base plate and the spacer when the tightening bolt is made to pass through the inserting hole of the supporting member. Thus, in a case where the operator selects a wrong spacer and thus needs to replace the wrong spacer with one with proper length, for example, it takes time to redo the work.

Patent Literature 1: Japanese National Patent Appln. Public Disclosure No. 2003-528459

BRIEF SUMMARY

An electrical connecting apparatus is provided which dispenses with any adjustment to flatten a probe base plate after attaching a probe assembly to an electrical connecting apparatus and which enables relatively easy assembling.

An electrical connecting apparatus according to an embodiment comprises a supporting member, a flat plate-like probe base plate arranged to be spaced from one surface of the supporting member, having one surface opposed to one surface of the supporting member and the other surface opposite one surface, and having provided thereon multiple probes electrically connected with a tester and the tips of said probes abutting on electrical connecting terminals of a device under test to undergo an electrical test by the tester, a securing portion formed on one surface of the probe base plate and provided with a screw hole opened at the top portion, a generally cylindrical spacer maintaining a distance from one surface of the supporting member to the top face of the securing portion, a screw member tightening the supporting member and the probe base plate with a space in accordance with the length of the spacer, and a means for restricting movement of the spacer in the axial direction relative to the supporting member. The spacer has a head portion whose underside is mounted on the other surface of the supporting member and a body portion communicating with the head portion at one end, arranged to pass through a through hole formed in the supporting member, and whose other end is arranged to abut on the top face of the securing portion. The screw member is inserted from the head portion side of the spacer to pass through the spacer, and movement of the spacer in the axial direction is restricted by the restricting means. The tip end of the screw member projecting from the other end of the spacer is screwed in the screw hole of the securing portion.

In certain embodiments, since the spacer can be inserted into the through hole of the supporting member from its body portion and arranged to abut at the tip end of its body portion on the top face of the securing portion, and the screw member can be inserted into a guide hole of the spacer from the head portion side of the spacer, the spacer and the screw member can be incorporated into component members such as a supporting plate, a wiring plate, etc., from the other surface side of the supporting member individually or in a state where the two portions are assembled in advance. Thus, it is possible to simplify the assembling work more than in a conventional case, and simplification of the manufacturing process enables reduction in the manufacturing cost of the electrical connecting apparatus.

As the spacer, a spacer having a length dimension required to align height positions of tips of the probes on the same imaginary plane in cooperation with the securing portion may be applied.

The restricting means may comprise a female screw groove formed in the through hole of the supporting member and a male screw groove formed on the spacer so as to be screwed into the female screw groove.

The male screw groove may be formed at the body portion of the spacer.

The restricting means may consist of a clasp covering the head portion of the spacer and arranged on the other surface of the supporting member and a screw member securing the clasp on the supporting member.

On the other surface of the supporting member, a recess housing the head portion of the spacer may be formed to surround the through hole. In this case, the clasp is secured by the screw member to close the open end of the recess.

The securing portion may be formed by securing a nut member on the probe base plate.

As the screw member, a bolt having a head portion and a shaft portion communicating with the head portion may be used.

Also, as the spacer, a spacer having such a length as a distance from the underside of its head portion to the other end of the shaft portion is appropriate to maintain the tips of the probes on the same imaginary plane may be selected and used.

Between the supporting member and the probe base plate, a wiring base plate having a circuit to be connected with the tester and having a through hole permitting the screw member to pass therethrough may be arranged. Also, between the wiring base plate and the probe base plate, a connector having a through hole permitting the screw member to pass therethrough and connecting the circuit of the wiring base plate with each probe of the probe base plate may be arranged. In this case, the screw member is arranged to pass through the respective through holes of the wiring base plate and the connector, and after the spacer is inserted into the respective through holes in relation to the screw member, the probe base plate is coupled with the supporting member by tightening of the screw member into the securing portion.

Further, a lock mechanism may be arranged at the central portion of the probe base plate to penetrate the supporting member, the wiring base plate, and the connector. Via the lock mechanism, the probe base plate may be releasably secured to the supporting member at its central portion.

In relation to the lock mechanism, at the central portion on one surface of the probe base plate, a locking portion standing up from the probe base plate and having a large diameter portion and a small diameter portion communicating with the large diameter portion via a shoulder portion and reaching a top portion of the locking portion may be formed. In this case, the lock mechanism includes a lock holder member having a cylindrical portion penetrating the supporting member, the wiring base plate, and the connector from the other surface of the supporting member and extending to the top portion of the locking portion and a flange portion extending on the other surface of the supporting member at one end of the cylindrical portion, a lock shaft arranged so that its one end can project from the flange portion and enabling to move in the axial direction of the lock holder member by operation of a cam lever provided at one end, a locking member that can be operated between a locking position at which its part projects from the lock holder member to engage with the shoulder portion and a releasing position at which it is housed in the lock holder by movement of the shaft in the axial direction, and an elastic member giving the lock shaft eccentric force to hold the locking member at its releasing position.

The operation of the cam lever of the lock mechanism can secure the central portion of the probe base plate to the supporting member and release this securing.

As the connector, a pogo pin connector having a pogo pin contact as a contact may be used.

With certain embodiments, as described above, an appropriate spacer can be selected, and the spacer and a screw member can be incorporated into a supporting plate from the same side of the supporting plate. Also, since the spacer and the screw member can be incorporated into component members such as the supporting plate, a wiring plate, etc., by tightening of the screw member, it is possible to simplify the assembling work more than in a conventional case, and simplification of the manufacturing process enables reduction in the manufacturing cost of an electrical connecting apparatus.

DESCRIPTION OF EMBODIMENTS

Figure 1:
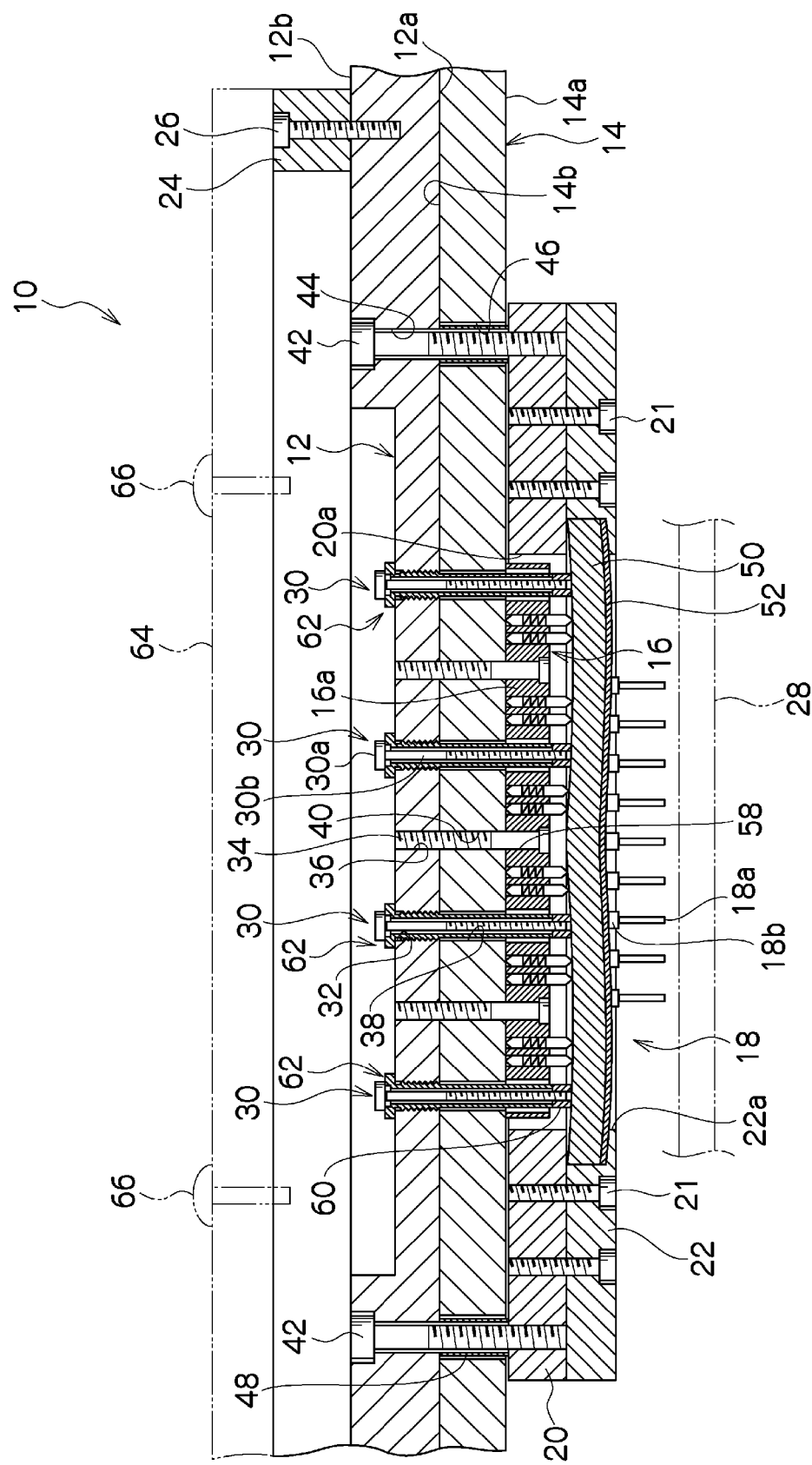
FIG. 1 is a vertical cross-sectional view showing one embodiment of an electrical connecting apparatus.

An electrical connecting apparatus 10 comprises: a flat plate-like supporting member 12, the underside 12a of which becomes a flat mounting reference plane; a circular flat plate-like wiring base plate 14 held by the mounting plane 12a of the supporting member; a probe base plate 18 electrically connected with the wiring base plate through an electrical connector 16; a base ring 20 with a central opening 20a formed for receiving the electrical connector 16; and a securing ring 22 secured on the base ring 20 through bolts 21 for sandwiching the edge portion of the probe base plate 18 in cooperation with the edge portion of the central opening 20a of the base ring, as shown in FIG. 1.

The securing ring 22 has in its central portion a central opening 22a permitting probes 18a of the probe base plate 18 to be exposed. In the illustration, a thermal deformation inhibitor 24 for restraining a thermal deformation of the supporting member 12 which holds the wiring base plate 14 is attached to an upper face 12b of the supporting member 12 by bolts 26.

As conventionally well known, the electrical connecting apparatus 10 is used for connecting each connecting pad which is a connecting terminal of an IC with an electric circuit of a tester for electrical tests of a plurality of ICs (integrated circuits) which are incorporated into a semiconductor wafer 28, for example.

The wiring base plate 14 includes a generally circular plate-like polyimide resin substrate, for example, and on the underside 14a thereof, a plurality of conventionally well-known connecting terminals (not shown) to be connected with the electric circuits of the tester are arranged like a rectangular matrix.

The supporting member 12 is a plate-like frame member made of, for example, a stainless steel plate whose mounting plane 12a is disposed to abut on an upper face 14b of the wiring base plate 14. The thermal deformation inhibitor 24 shown in FIG. 1 is an annular member to be disposed to cover the circumferential portion in the upper face 12b of the supporting member 12, and is made of a metal material such as aluminum. This thermal deformation inhibitor 24 restrains retroflexion of the supporting member 12 that occurs when a significant temperature difference occurs between the mounting plane 12a and the upper face 12b of the supporting member 12 under, e.g., a burn-in test of a device under test such as the aforementioned IC.

Figure 2:
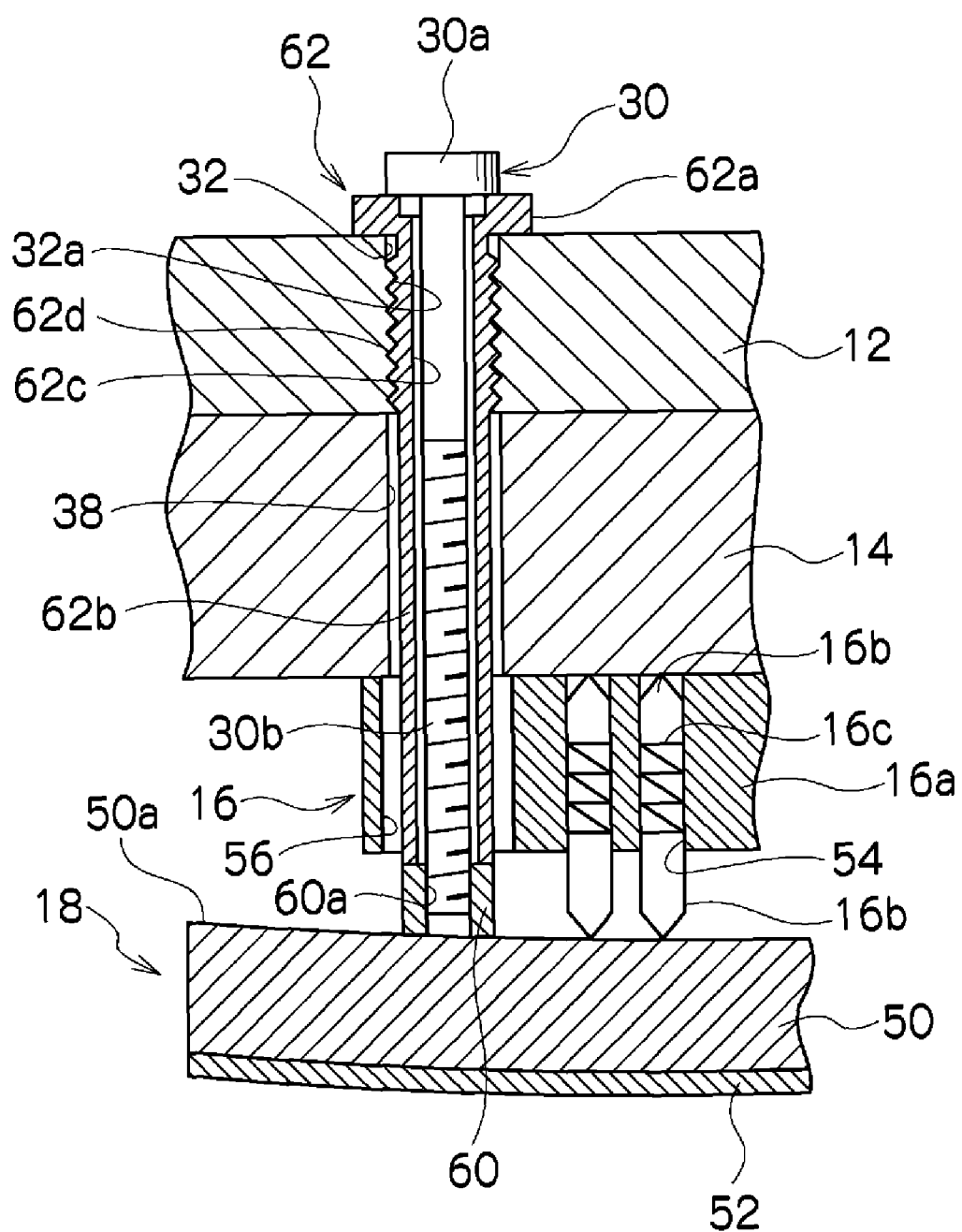
FIG. 2 is an enlarged view similar to FIG. 1 showing a main part of the electrical connecting apparatus shown in FIG. 1.
Figure 3:
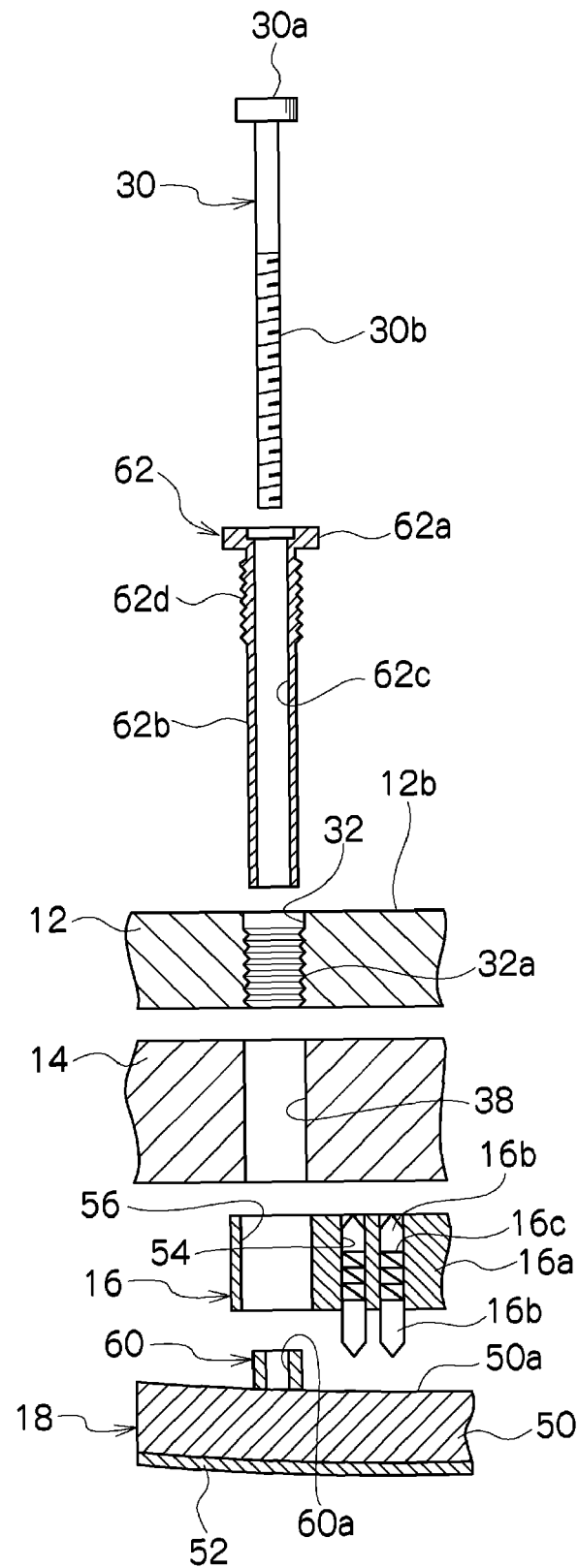
FIG. 3 is an exploded vertical cross-sectional view showing a main part of the electrical connecting apparatus shown in FIG. 2.

FIG. 2 is an enlarged view of a main part of the electrical connecting apparatus 10 shown in FIG. 1, and FIG. 3 is an exploded view of the main part of the electrical connecting apparatus 10.

As clearly shown in FIGS. 2 and 3, in the supporting member 12 are formed though holes 32 each permitting a screw member 30 for attaching the probe base plate 18 to the supporting member 12 to pass therethrough. The screw member 30 is a conventionally well-known bolt 30 having a head portion 30a and a shaft portion 30b in the illustration. Also, in the supporting member 12 are formed screw holes 36 in each of which a mounting screw 34 for mounting the electrical connector 16 is screwed as shown in FIG. 1.

In the wiring base plate 14 are formed through holes 38, 40 respectively corresponding to the through holes 32 and the screw holes 36 of the support member 12 as shown in FIG. 1. These through holes 38, 40 are formed at areas that do not influence electrical connection of the wiring base plate 14 as in the conventional case. Also, at the outer edge portions of the supporting member 12 and the wiring base plate 14 are formed bolt holes 44, 46 permitting mounting bolts 42 for coupling the base ring 20 with the supporting member 12 to pass therethrough. In the bolt hole 44 of the wiring base plate 14 is disposed a conventionally well-known sleeve 48 for protecting the wiring base plate 14 from a tightening force of the mounting bolt 42.

The probe base plate 18 includes, as has been well known, for example, a base plate member 50 made of a ceramic plate, and a multi-layered wiring layer 52 formed on the underside of the base plate member, i.e., the ceramic plate. The multi-layered wiring layer 52 has, as has been well known although not shown in the figure, a multi-layered plate made of an electrically insulating, e.g., a polyimide resin material, and wiring paths formed among the multi-layered plates. On the underside of the multi-layered wiring layer 52 are formed probe lands 18b each electrically connected with the aforementioned wiring path of the multi-layered wiring layer. The upper end of each probe 18a is connected with the corresponding probe land 18b, and thus each probe 18a is attached to the probe base plate 18 to project downward from the underside of the multi-layered wiring layer 52 and is connected with the wiring path of the multi-layered wiring layer 52 through each corresponding probe land 18b.

In the example shown in FIG. 1, a sinuate bending deformation is produced in the probe base plate 18 (50, 52). This bending deformation of the probe base plate 18 is introduced into the probe base plate 18 in a free state in which the probe base plate 18 does not receive load, as clearly shown in FIG. 4, which shows the probe base plate 18 in a state before being attached. This deformation is sometimes introduced into the ceramic plate at the time of processing the ceramic plate 50, and the height difference between the lowest part and the highest part on the underside of the probe base plate 18 is sometimes several tens of micrometers to one hundred micrometers, for example. Regardless of this bending deformation of the probe base plate 18, the lower ends of the probe lands 18b are aligned on a plane P1 parallel to an imaginary plane P of the probe base plate 18 by, e.g., a flat-surface grinding process. Also, since the probes 18a connected to the respective probe lands 18b are formed to have the same length, the lower ends or the tip ends of the respective probes 18a are aligned on a plane P2 parallel to the imaginary plane P in a free state of the probe base plate 18.

On an upper face 50a of the ceramic plate 50 are formed electrical connecting portions to be connected to the respective corresponding probes 18a through the wiring paths of the multi-layered wiring layer 52 although not shown in the figure. These electrical connecting portions are formed to correspond to the aforementioned multiple connecting terminals arranged on the underside 14a of the wiring base plate 14 like a rectangular matrix, as has been well known.

Between the electrical connecting portions formed on the upper face 50a of the ceramic plate 50 and the connecting terminals of the wiring base plate 14 corresponding to the respective electrical connecting portions is arranged the aforementioned electrical connector 16 to connect the two corresponding portions.

The electrical connector 16 includes, as enlarged and shown in FIG. 2, a pogo pin block 16a made of an electrically insulating plate-like member with a plurality of through holes 54 formed in the thickness direction, and a pair of pogo pins 16b, 16b to be accommodated in series within each through hole 54 slidably in the axial direction of the through hole 54 such that each pogo pin is prevented from falling off the through hole 54. Between each pair of pogo pins 16b and 16b is disposed a helical coil spring 16c which gives both pogo pins 16b, 16b eccentric force in a direction to be away from each other to become a conductive path between both pogo pins. Also, in the pogo pin block 16a are formed through holes 56 each aligned with the through holes 32, 38 to permit the mounting bolt 30 to pass therethrough. Further, in the pogo pin block 16a are formed through holes 58 each aligned with the screw hole 36 and the through hole 40 to receive the mounting screw 34, as shown in FIG. 1.

In an assembled state of the electrical connecting apparatus 10 shown in FIGS. 1 and 2, one pogo pin 16b of each pair of pogo pins 16b, 16b is press-connected with the connecting terminal of the wiring base plate 14 by the spring force of the helical coil spring 16c of the electrical connector 16, while the other pogo pin 16b is press-connected with the electrical connecting portion of the ceramic plate 50 corresponding to the connecting terminal of the wiring base plate 14. Accordingly, the probe 18a provided in each probe land 18b is surely connected with the corresponding connecting terminal of the wiring base plate 14. As a result, when the tips of the probes 18a are brought into contact with the connecting pads of the IC formed on the semiconductor wafer 28, the connecting pads are connected with the tester through the corresponding probes 18a, electrical connector 16, and wiring base plate 14, thereby enabling an electrical test of the electric circuit of the semiconductor wafer 28 by the tester.

Figure 4:
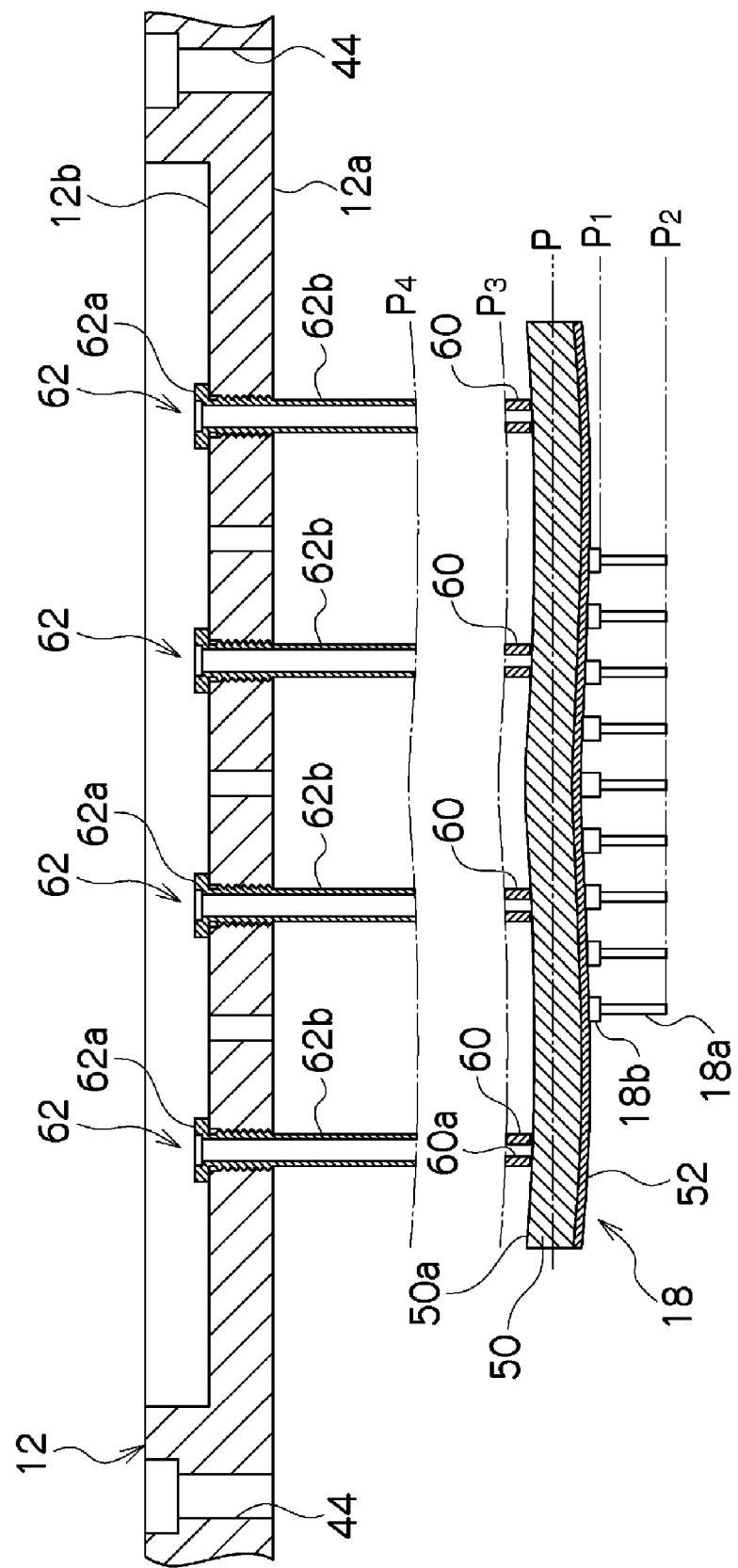
FIG. 4 explains a relation between spacers and securing portions of the electrical connecting apparatus according to an embodiment.

In assembling the electrical connecting apparatus 10, in order to couple the probe base plate 18 with the supporting member 12, securing portions 60 are formed on the upper face of the probe base plate 18 or the upper face 50a of the ceramic plate 50, as shown in FIGS. 2 to 4. On the top face of this securing portion is opened a female screw hole 60a screwed by the tip end portion of the mounting bolt 30 passing through the through hole 32 of the supporting member 12 and the through hole 38 of the wiring base plate 14.

The securing portion 60 can be formed by fixing a female screw member such as a nut to the upper face 50a of the ceramic plate 50 by adhesive.

As described above, the aforementioned bending deformation is produced in the probe base plate 18 shown in FIG. 4 in a free state, and the height dimensions of the respective securing portions 60 provided on this probe base plate 18 are equal to one another. Thus, in the example shown in FIG. 4, an imaginary plane P3 joining the top faces of the respective securing portions 60 is a curved plane corresponding to the bend of the probe base plate 18.

For assembling of the electrical connecting apparatus 10, in each securing portion 60 is screwed the mounting bolt 30 or the screw member 30 passing through the respective through holes 32, 38, and 56 of the supporting member 12, the wiring base plate 14, and the electrical connector 16, and in relation to the screw member, a cylindrical spacer 62 is used.

The spacer 62 includes, as shown in FIGS. 2 and 3, a head portion 62a and a body portion 62b having a shorter outer diameter than the outer diameter of the head portion. One end of the body portion 62b communicates with the bottom face of the head portion 62a. At the head portion 62a and the body portion 62b, a guide hole 62c permitting the shaft portion 30b of the mounting bolt 30 to be inserted therein penetrates in the axial direction of the spacer 62.

Also, in the illustration, a female screw groove 32a is formed in the through hole 32 of the supporting member 12, and at the aforementioned one end of the body portion 62b of the spacer 62 or in the vicinity of the head portion 62a is formed a male screw groove 62d screwed into the female screw groove 32a.

Accordingly, the body portion 62b of the spacer 62 is inserted into the through hole 32 from the upper face 12b of the supporting member 12 as shown in FIG. 3, and the male screw groove 62d formed in the body portion 62b is screwed into the female screw groove 32a of the through hole 32 as shown in FIG. 2, thereby abutting the bottom face of the head portion 62a on the upper face 12b of the supporting member 12.

The tightening of each spacer 62 to the supporting member 12 by screwing of the male screw groove 62d of the spacer 62 into the female screw groove 32a of the supporting member 12 is preferably performed with use of a torque wrench. Since this prevents excessive tightening per spacer 62 and enables each spacer 62 to be coupled with the supporting member 12 with uniform tightening force, the bottom face of the head portion 62a of each spacer 62 can be made to abut on the corresponding upper face 12b of the supporting member 12 with predetermined uniform thrusting force.

In this abutting state, the body portion 62b of the spacer 62 projects downward from the pogo pin block 16a of the electrical connector 16 through the through hole 38 of the wiring base plate 14 and the through hole 56 of the electrical connector 16 and abuts on the top face of the corresponding securing portion 60.

Also, as for the mounting bolt 30, its shaft portion 30b is inserted into the guide hole 62c of the spacer 62 from the upper face 12b side of the supporting member 12, and the tip end portion of the shaft portion is screwed into the female screw hole 60a of the corresponding securing portion 60. This tightening of the mounting bolt 30 integrates the supporting member 12, the wiring base plate 14, the electrical connector 16, and the probe base plate 18. For this tightening of each bolt 30 as well, a torque wrench is preferably used as in the case of tightening of each spacer 62 to prevent variation from occurring among bolts 30.

In this tightening state of the mounting bolts 30, by maintaining the bend of the ceramic plate 50, the plane P2 of the tips of the probes 18a can be maintained. Also, as shown in FIG. 4, by appropriately selecting the length dimension of the body portion 62b of each spacer 62 in accordance with the height position of the corresponding securing portion 60, the lower end of the body portion 62b of each spacer 62 can be located along an imaginary curved plane P4 parallel to the imaginary curved plane P3 of the top faces of the securing portions 60.

Accordingly, as a spacer 62 corresponding to each securing portion 60, by selecting a spacer 62 whose body portion 62b has an appropriate length dimension in accordance with the height position of the corresponding securing portion 60, the tips of the probes 18a can be aligned on the plane P2.

Figure 5:
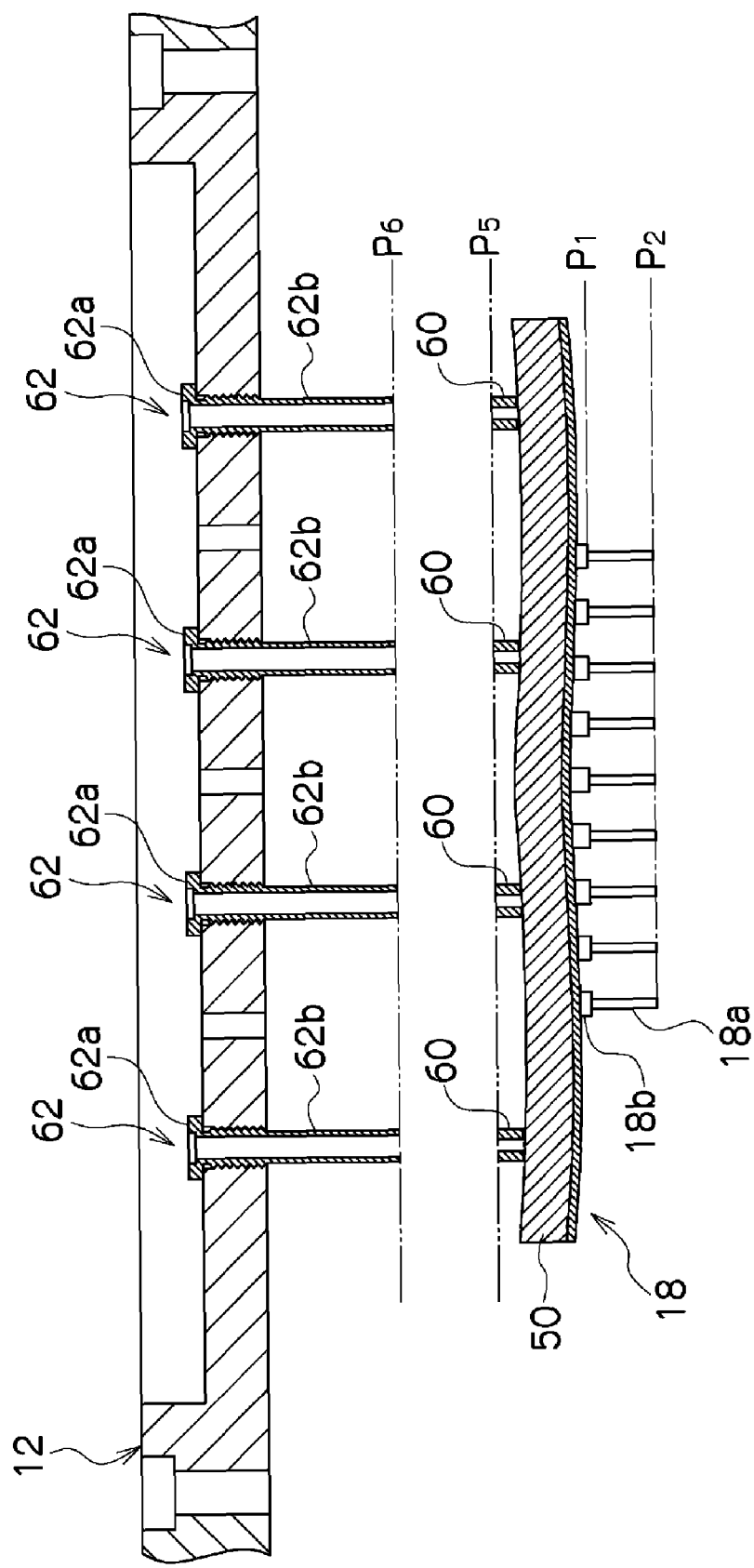
FIG. 5 is a view similar to FIG. 4 showing a relation between the spacers and the securing portions of another electrical connecting apparatus according to an embodiment.

In the aforementioned flat-surface grinding process to align the lower end surfaces of the probe lands 18b to be flat, a backing plate is attached to the probe base plate 18 in the free deformation state shown in FIGS. 4 and 5 to enable the lower end surfaces of the probe lands 18b to be flat.

By using this backing plate, the probe base plate 18 is not maintained in the free deformation state but maintained in a more moderate deformation state than the free deformation state shown in FIGS. 4 and 5 during the grinding process of the probe lands 18b. When the probe base plate 18 is released from the backing plate after the lower end surfaces of the probe lands 18b undergo the flat-surface grinding process in this state, the probe base plate 18 is returned to the free state shown in FIGS. 4 and 5. In such attachment of the probe base plate 18, a spacer having a length required to recover the deformation of the probe base plate 18 having occurred during the aforementioned grinding process of the probe lands 18b with use of the backing plate is selected and used as each spacer 62 in order to align the tips of the probes 18a of the probe base plate 18 on the imaginary plane P2.

Also, in the forgoing description, by having the spacer 62 screwed into the supporting member 12, integral movement of the bolt 30 and the spacer 62 in relation to the supporting member 12 in their (30, 62) axial direction is blocked when thrusting force that overcomes the helical coil spring 16c of the pogo pin assembly 16 acts on the probe base plate 18.

Instead of having the spacer 62 screwed into the supporting member 12, the spacer 62 may be fixed to the through hole 32 of the supporting member 12 with use of, e.g., adhesive. This can dispense with the female screw groove 32a of the through hole 32 and the male screw groove 62d of the spacer 62. Also, in this case, in a state where the mounting bolt 30 is inserted in the guide hole 62c of the spacer 62 in advance, both 30, 62 can be inserted into the respective through holes 32, 36, and 54 of the supporting member 12, the wiring base plate 14, and the electrical connector 16 integrally.

In either case, without incorporating the spacer 62 from the side of the mounting plane 12a of the supporting member 12, the spacer 62 and the mounting bolt 30 can be incorporated from the upper face 12b of the supporting member 12, and thus their incorporating work becomes easier than in a conventional case.

After incorporating the probe base plate 18 into the supporting member 12, a cover 64 covering the upper face 12b of the supporting member 12 can be mounted on the thermal deformation inhibitor 24 with screw members 66 as shown with the imaginary line in FIG. 1. Mounting this cover 64 can prevent dust and also prevent unnecessary operations of the bolts 30 and the spacers 62 reliably.

Also, without setting the height dimensions of the securing portions 60 to be identical as shown in FIG. 4, a flat-surface grinding process can be done on the top portions of the securing portions 60 so that the top face of each securing portion 60 may be a plane P5 parallel to the imaginary plane P2 in a state where the bend of the probe base plate 18 in a free state is maintained so that the tips of the probes 18a of the probe base plate 18 may be aligned on the imaginary plane P2. In this case, by using spacers respectively having body portions 62b of the same length dimension, the tips of the probes 18a can be made to align on the imaginary plane P2a.

In the foregoing description, the probe base plate 18 is coupled with the supporting member 12 at its central portion and its peripheral portion by the spacers 62 and the bolts 30. On the other hand, in the example shown in FIG. 6, the central portion of the probe base plate 18 is releasably coupled with the supporting member 12 by a lock mechanism 68.

Figure 7:
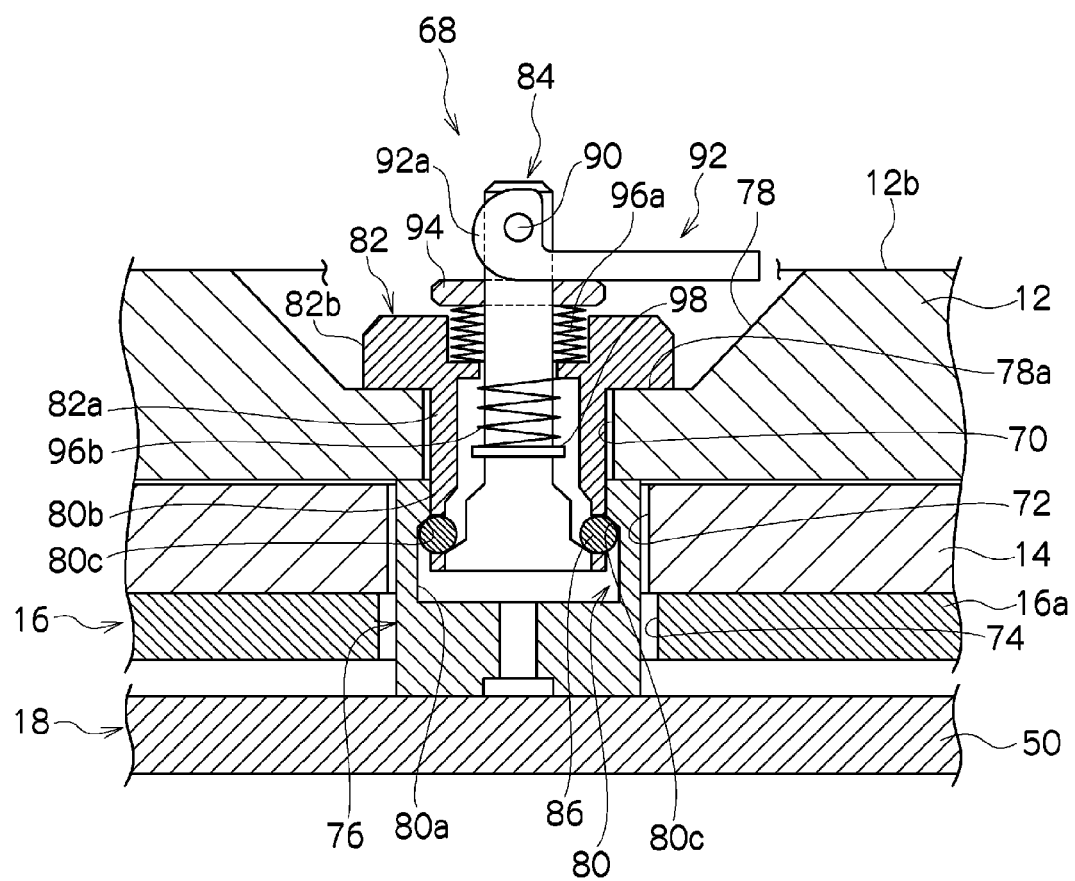
FIG. 7 is an enlarged view similar to FIG. 6 showing a main part of the electrical connecting apparatus shown in FIG. 6.

The lock mechanism 68 is incorporated in relation to central holes 70, 72, and 74 formed to align their axes coaxially with the supporting member 12, wiring base plate 14, and pogo pin block 16a, respectively, as shown in FIG. 7. Also, on the upper face 50a of the ceramic plate 50, which is the base plate member 50 of the probe base plate 18, a locking portion 76 for the lock mechanism 68 stands up toward the underside 12a of the supporting member 12 within the central holes 72 and 74. On the upper face 12b of the supporting member 12 is formed a recess 78 aligned with the central hole 70.

Figure 8:
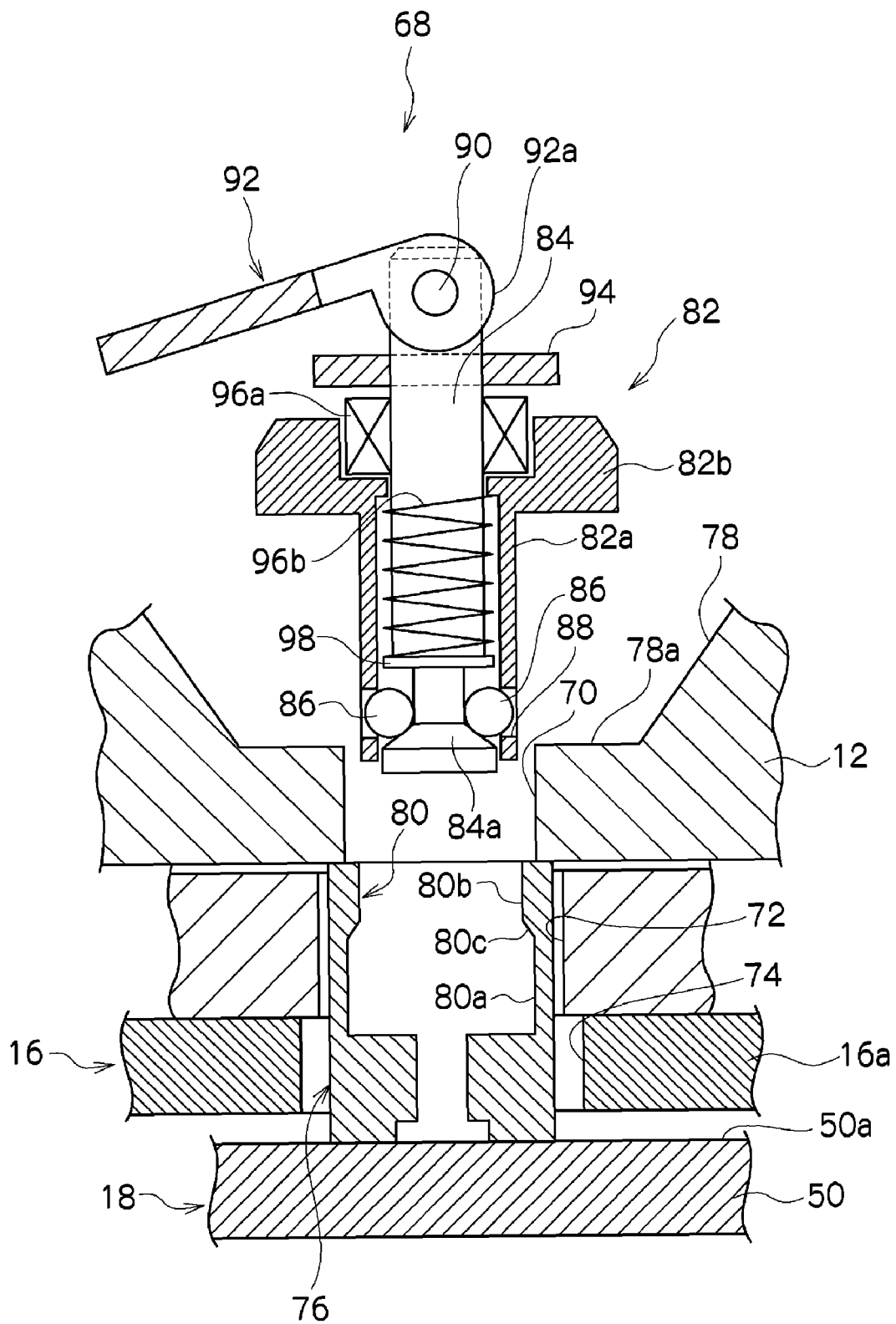
FIG. 8 is an exploded view similar to FIG. 6 showing a main part of the electrical connecting apparatus shown in FIG. 6.
Figure 9:
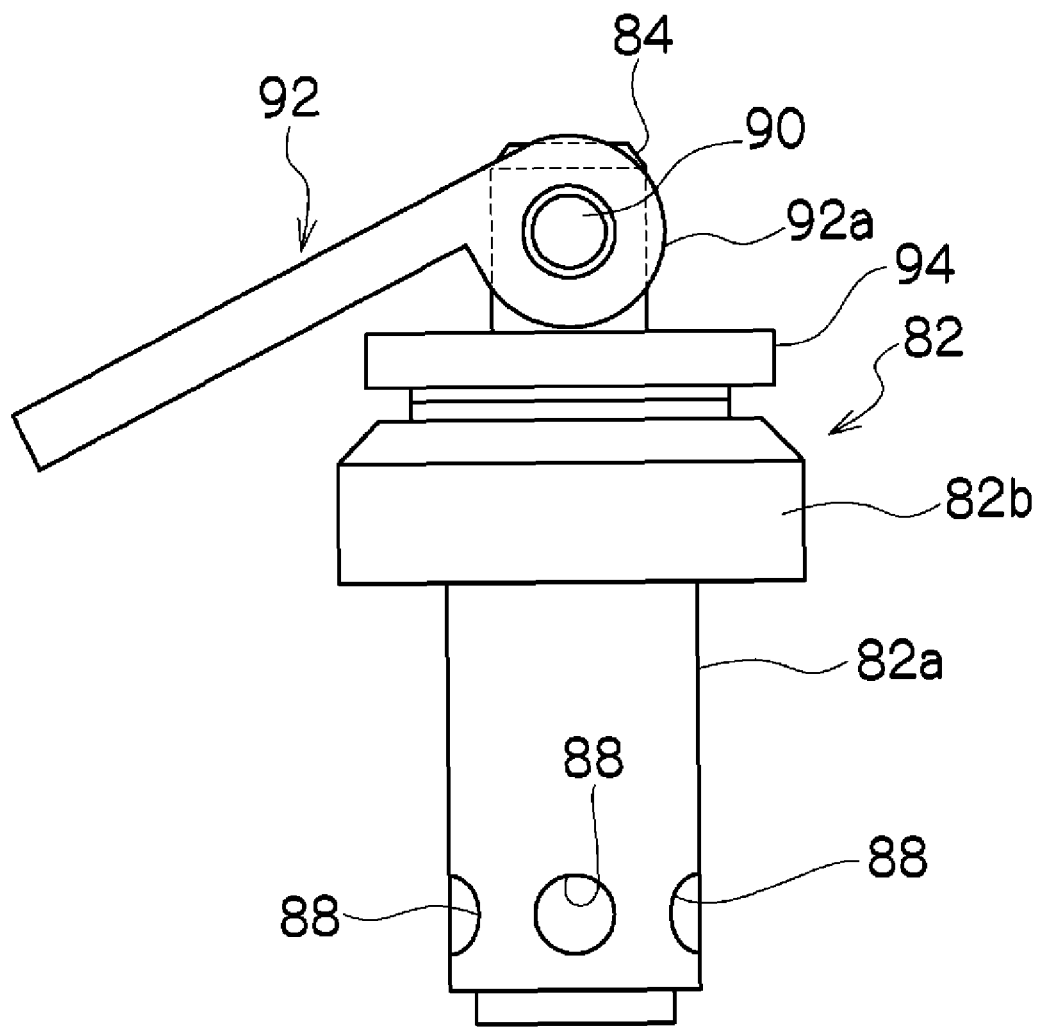
FIG. 9 is a front view showing an outline of a lock mechanism shown in FIG. 6.

In the locking portion 76 is formed a cylindrical recess 80 opened from its internal portion to the upper end, as clearly shown in FIG. 8. The recess 80 has a large diameter portion 80a and a small diameter portion 80b coaxially communicating with the large diameter portion and is opened at the small diameter portion. On the peripheral wall of the recess 80 where both the diameter portions 80a and 80b communicate with each other is formed a shoulder portion 80c comprising an inclined wall portion whose diameter gradually decreases toward the small diameter portion 80b.

As shown in FIGS. 7 and 8, the lock mechanism 68 includes a lock holder member 82 having a cylindrical portion 82a that can be inserted in the central hole 70 of the supporting member 12 and the recess 80 of the locking portion 76 and a flange portion 82b formed at one end of the cylindrical portion, a lock shaft 84 arranged in the lock holder member along the axial direction of the lock holder member 82, and spherical locking members 86 that can be operated by operation of the lock shaft.

The underside of the flange portion 82b formed at one end of the cylindrical portion 82a can abut on a flat bottom portion 78a of the recess 78, as shown in FIG. 7. Also, the other end or the lower end of the lock holder member 82 can extend into the large diameter portion 80a of the recess 80. In the vicinity of the lower end of this large diameter portion 80a, openings 88 permitting the spherical locking members 86 to project partially are formed to correspond to the locking members 86 and to be spaced in the circumferential direction of the large diameter portion 80a.

The upper end of the lock shaft 84 projects from the lock holder member 82, at the projecting end of which is pivotally provided a cam lever 92 via a pivot 90. At the cam lever 92 is formed a cam surface 92a that slides on a washer 94 arranged over the upper face of the flange portion 82b of the lock holder member 82 in order to move the lock shaft 84 in the axial direction by a rotating operation of the cam lever 92 around the pivot 90.

At the lower end of the lock shaft 84 is formed an inclined surface 84a that holds the locking members 86 and that makes a part of each locking member 86 project from the opening 88 outward in the radial direction of the cylindrical portion 82a of the lock holder member 82 when the lock shaft 84 is pulled upward in relation to the lock holder member 82.

In relation to the lock shaft 84, between the washer 94 and the flange portion 82b of the lock holder member 82 is arranged a first helical coil spring 96a giving the two parts 94 and 82b spring force in a direction to be away from each other. Also, in relation to the lock shaft 84, between an E ring 98 locked on the shaft and the flange portion 82b is arranged a second helical coil spring 96b giving the two parts 98 and 82b spring force in a direction to be away from each other. The first helical coil spring 96a thrusts the washer 94 on the cam surface 92a of the cam lever 92 by its spring force mainly. Also, the second helical coil spring 96b pushes the lock shaft 84 toward the lower end in relation to the lock holder member 82 by its spring force mainly.

In a case of the rotating posture of the cam lever 92 shown in FIG. 8, the cam surface 92a is held at a position to abut on the washer 94 by the spring force of the first helical coil spring 96a. In this rotating posture of the cam lever 92, the lock shaft 84 is held at the lower end position at which the inclined surface 84a does not push the locking members 86 out of the openings 88 of the cylindrical portion 82a.

Thus, as shown in FIG. 8, the lower end of the cylindrical portion 82a of the lock holder member 82 can be inserted into the large diameter portion 80a of the locking portion 76 without having the locking members 86 interfere with the small diameter portion 80b of the locking portion 76.

In a state where the lower end of the cylindrical portion 82a of the lock holder member 82 is inserted within the large diameter portion 80a of the locking portion 76, the cam lever 92 can be rotated and operated to the rotating posture shown in FIG. 7. Due to this rotating operation of the cam lever 92, the lock shaft 84 can be moved to the upper end position shown in FIG. 7, overcoming the spring force of the second helical coil spring 96b, and due to the holding effect of the cam lever 92, the lock shaft 84 can be held at the aforementioned upper end position.

When the lock shaft 84 is at the aforementioned upper end position, the inclined surface 84a of the lock shaft thrusts the locking members 86 to the shoulder portion 80c of the locking portion 76 via the openings 88 of the lock holder member 82. By this engagement of the locking members 86 with the shoulder portion 80c, the lock mechanism 68 is integrally coupled with the locking portion 76 so as to clamp the edge portion of the central hole 70 of the supporting member 12 between the lock holder member 82 and the locking portion 76. Accordingly, the lock mechanism 68 secures the central portion of the probe base plate 18 to the supporting member 12 with a predetermined space from the supporting member 12 in cooperation with its lock holder member 82 and the locking member 76. That is, the lock mechanism 68 secures by its spacing function the central portion of the probe base plate 18 to the supporting member 12 with a space defined by the lock holder member 82 and the locking portion 76 from the bottom portion 78a of the recess 78 formed in the supporting member 12.

Also, by returning a cam lever 92 to the rotating posture shown in FIG. 8, the aforementioned locking function of the lock mechanism 68 can be released, and the lock mechanism 68 can be pulled out of the supporting member 12 toward the pulling position shown in FIG. 8.

Figure 6:
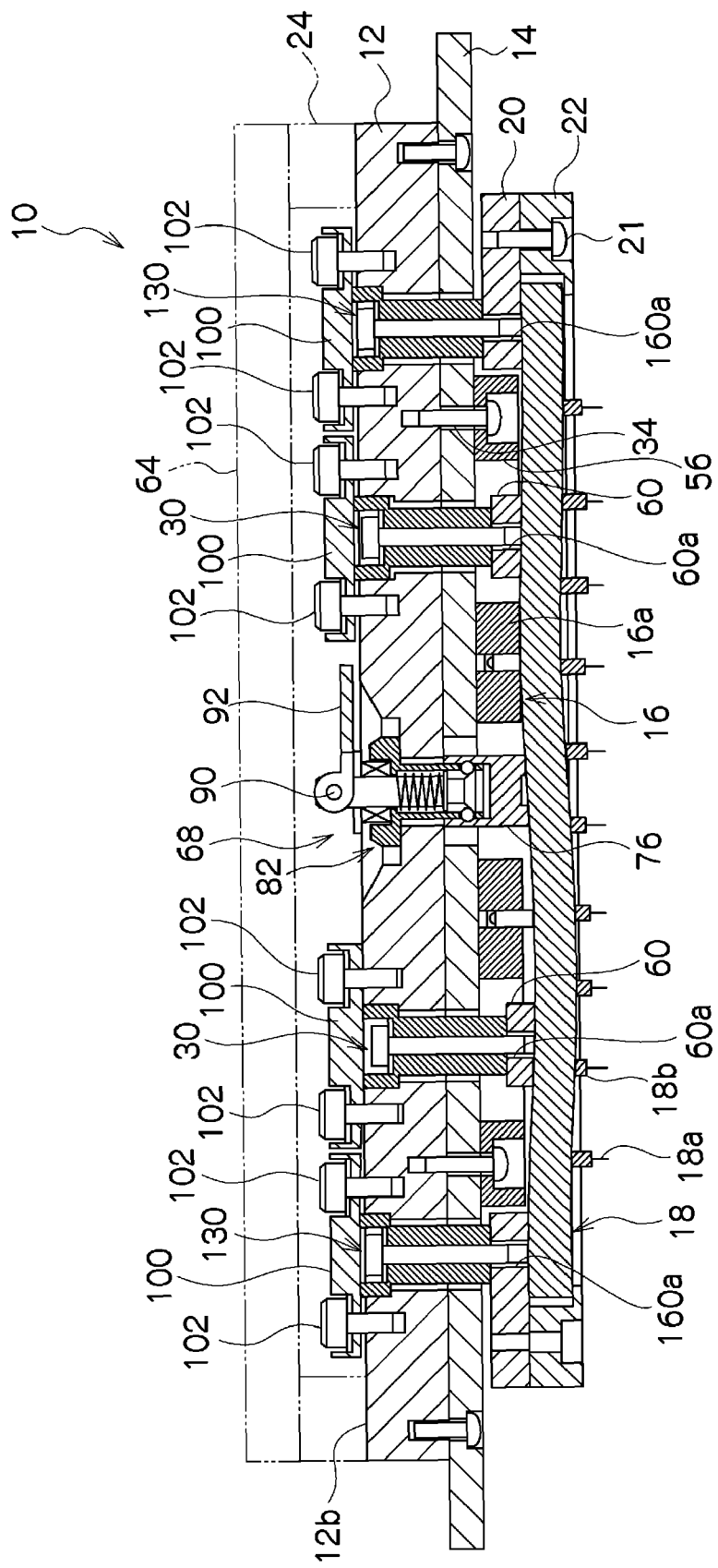
FIG. 6 is a view similar to FIG. 1 showing another embodiment of the electrical connecting apparatus.

In the example shown in FIG. 6, at the peripheral portion of the probe base plate 18 surrounding the lock mechanism 68 are applied the spacers 62 similar to ones mentioned above. However, in the example shown in FIG. 6, as a restricting means, a clasp 100 and a pair of screw members 102 are used instead of screw fitting. Also, in the example shown in FIG. 6, the bolts 30 inserted in the spacers 62 arranged at the peripheral portion except the spacers 62 arranged on the outermost circumference of the wiring base plate 14 are screwed in the securing portions 60 of the probe base plate 18 in the same manner as in the example shown in FIG. 1. On the other hand, bolts 130 inserted in the spacers 62 arranged on the outermost circumference of the wiring base plate 14 are screwed in screw holes 160a of the base ring 20, and the base ring 20, in which these screw holes 160a are provided, functions as the securing portions 60.

Thus, as the spacers 62 inserted by the bolts 30 and 130, ones having length dimensions required to align the respective tips of the probes 18a of the probe base plate 18 on the imaginary plane P2 are selected and used in consideration of the height dimensions of the corresponding securing portions 60 based on the relation with the aforementioned spacer function of the lock mechanism 68.

Figure 10:
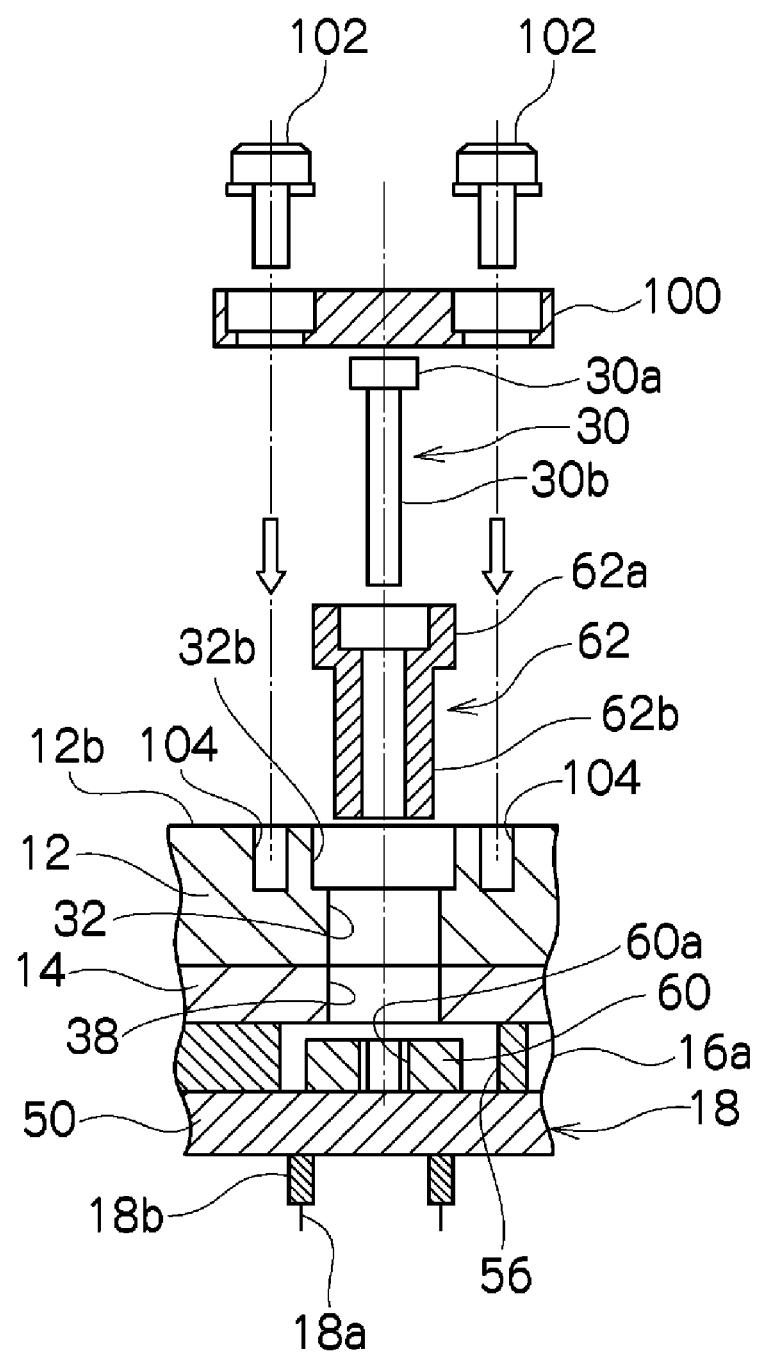
FIG. 10 is an exploded vertical cross-sectional view showing a spacer and a restricting means of the electrical connecting apparatus shown in FIG. 6.

As is apparent from FIG. 10, which is an exploded view of the aforementioned restricting means, on the upper face 12b of the supporting member 12 is formed a recess 32b to house the head portion 62a of the spacer 62 in relation to the through hole 32. The spacer 62 is inserted in the through hole 32 so that the lower end of the body portion 62b may abut on the top face of the corresponding securing portion 60, and so that the head portion 62a may be buried in the recess 32b.

Also, as for the bolt 30 (130), the shaft portion 30b is screwed into the female screw hole 60a (160a) of the securing portion 60 so that its head portion 30a may be buried within the head portion 62a of the spacer 62. In this tightening of the bolt as well, a torque wrench is preferably used in the same manner as explained with reference to FIG. 1.

After tightening of these bolts 30 (130), the tip end portion of each screw member 102 passing through the clasp 100 is screwed into a corresponding screw hole 104 formed on the upper face 12b of the supporting member 12. By tightening of this screw member 102, each clasp 100 is secured on the upper face 12b of the supporting member 12 so that its underside may abut on the top face of the head portion 62a of the corresponding spacer 62, as shown in FIG. 6. This prevents relative movement of each spacer 62 in the axial direction in relation to the supporting member 12.

Instead of the clasp 100 and the screw members 102 shown in FIG. 6, the restricting means such as screwing or adhesive shown in FIG. 1 may be used.

The embodiments described here can be applied to an electrical connecting apparatus having a flat probe base plate to which no bending deformation is introduced.

The described subject matter is not limited to the above embodiments but may be altered in various ways without departing from the spirit and scope presented here.

REFERENCE SIGNS LIST 10 electrical connecting apparatus
12 supporting member
14 wiring base plate
16 electrical connector
18 probe base plate
18a probe
30 mounting bolt (screw member)
30a head portion of the bolt
30b shaft portion of the bolt
32, 38 through hole
32a, 62d, 100, 102 restricting means
60 securing portion
60a, 160a female screw hole of the securing portion
62 spacer
62a head portion of the spacer
62b body portion of the spacer
68 lock mechanism
76 locking portion
80a large diameter portion of the locking portion
80b small diameter portion of the locking portion
80c shoulder portion of the locking portion
82 lock holder member
82a cylindrical portion of the lock holder member
82b flange portion of the lock holder member
86 locking member
92 cam lever

The invention claimed is:

1. An electrical connecting apparatus comprising:
a supporting member;
a flat plate-like probe base plate arranged to be spaced from one surface of said supporting member, having one surface opposed to said one surface of said supporting member and the other surface opposed to said one surface, and having provided thereon multiple probes electrically connected with a tester and tips of said probes abutting on electrical connecting terminals of a device under test undergoing an electrical test by said tester;

a securing portion formed on said one surface of said probe base plate and provided with a screw hole opened at the top portion;

a generally cylindrical spacer maintaining a distance from said one surface of said supporting member to the top face of said securing portion;

a screw member tightening said supporting member and said probe base plate with a space in accordance with the length of said spacer; and a means for restricting movement of said spacer in the axial direction in relation to said supporting member, wherein said spacer has a head portion whose underside is mounted on the other surface of said supporting member and a body portion communicating with said head portion at one end, arranged to pass through a through hole formed in said supporting member, and whose other end is arranged to abut on the top face of said securing portion, wherein said screw member is inserted from the head portion side of said spacer to pass through said spacer, and wherein the tip end of said screw member projecting from said body portion of said spacer is screwed in said screw hole of said securing portion.

2. The electrical connecting apparatus according to claim 1, wherein said spacer has a length dimension required to align height positions of tips of said probes on the same imaginary plane in cooperation with said securing portion.

3. The electrical connecting apparatus according to claim 2, wherein as said spacer, a spacer having a distance from the underside of its head portion to the other end of said shaft portion appropriate to maintain said tips of said probes on the same imaginary plane is selected and used.

4. The electrical connecting apparatus according to claim 1, wherein said restricting means comprises a female screw groove formed in said through hole of said supporting member and a male screw groove formed on said spacer so as to be screwed into said female screw groove.

5. The electrical connecting apparatus according to claim 4, wherein said male screw groove is formed at said body portion of said spacer.

6. The electrical connecting apparatus according to claim 1, wherein said restricting means comprises a clasp covering said head portion of said spacer and arranged on said other surface of said supporting member and a screw member securing said clasp on said supporting member.

7. The electrical connecting apparatus according to claim 6, wherein on said other surface of said supporting member is formed a recess housing said head portion of said spacer to surround said through hole, and said clasp closes the opening end of said recess.

8. The electrical connecting apparatus according to claim 1, wherein said securing portion is formed of a screw member fixed on said probe base plate.

9. The electrical connecting apparatus according to claim 1, wherein said screw member is a bolt having a head portion and a shaft portion communicating with said head portion.

10. The electrical connecting apparatus according to claim 1, wherein between said supporting member and said probe base plate is arranged a wiring base plate having a circuit to be connected with said tester and having a through hole permitting said screw member to pass therethrough, and between said wiring base plate and said probe base plate is arranged a connector having a through hole permitting said screw member to pass therethrough and connecting said circuit of said wiring base plate with each probe of said probe base plate, and wherein said screw member is arranged to pass through said respective through holes of said wiring base plate and said connector, and after said spacer is inserted into said respective through holes in relation to said screw member, said probe base plate is coupled with said supporting member by tightening of said screw member into said securing portion.

11. The electrical connecting apparatus according to claim 10, further comprising a lock mechanism penetrating said supporting member, said wiring base plate, and said connector and arranged at the central portion of said probe base plate, wherein via said lock mechanism, said probe base plate is releasably secured to said supporting member at its central portion.

12. The electrical connecting apparatus according to claim 11, wherein at the central portion on said one surface of said probe base plate is formed a locking portion standing up from said probe base plate and having a large diameter portion and a small diameter portion communicating with said large diameter portion via a shoulder portion and reaching a top portion of said locking portion, and wherein said lock mechanism includes a lock holder member having a cylindrical portion penetrating said supporting member, said wiring base plate, and said connector from said other surface of said supporting member and extending to said top portion of said locking portion and a flange portion extending on said other surface of said supporting member at one end of said cylindrical portion, a lock shaft arranged so that its one end can project from said flange portion and can move in the axial direction of said lock holder member by operation of a cam lever provided at said one end, a locking member that can be operated between a locking position at which a part thereof projects from said lock holder member to engage with said shoulder portion and a releasing position at which it is housed in said lock holder by movement of said shaft in said axial direction, and an elastic member giving said lock shaft eccentric force to hold said locking member at its releasing position.

13. The electrical connecting apparatus according to claim 10, wherein said connector is a pogo pin connector having a pogo pin contact as a contact.

* * * * *